(12) United States Patent
Lu et al.

(10) Patent No.: US 12,148,654 B2
(45) Date of Patent: Nov. 19, 2024

(54) SEMICONDUCTOR STRUCTURE INCLUDING A TRENCH HAVING A HIGH ASPECT RATIO FORMED BY ETCHING AND ITS MANUFACTURING METHOD AS APPLIED TO FORMATION OF A CAPACITOR IN THE SEMICONDUCTOR STRUCTURE

(71) Applicant: CHANGXIN MEMORY TECHNOLOGIES, INC., Hefei (CN)

(72) Inventors: Yong Lu, Hefei (CN); Minghung Hsieh, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 343 days.

(21) Appl. No.: 17/595,575

(22) PCT Filed: Mar. 25, 2021

(86) PCT No.: PCT/CN2021/083066
§ 371 (c)(1),
(2) Date: Nov. 19, 2021

(87) PCT Pub. No.: WO2021/213129
PCT Pub. Date: Oct. 28, 2021

(65) Prior Publication Data
US 2022/0223468 A1    Jul. 14, 2022

(30) Foreign Application Priority Data
Apr. 21, 2020 (CN) .......................... 202010317800.1

(51) Int. Cl.
*H01L 21/768* (2006.01)
*H01L 21/311* (2006.01)
(Continued)

(52) U.S. Cl.
CPC .. *H01L 21/76805* (2013.01); *H01L 21/31111* (2013.01); *H01L 21/76816* (2013.01);
(Continued)

(58) Field of Classification Search
CPC ......... H01L 21/76805; H01L 21/31111; H01L 21/76816; H01L 21/76831;
(Continued)

(56) References Cited

U.S. PATENT DOCUMENTS 6,207,988 B1 * 3/2001 Tsuboi ............... H10B 12/0335
257/306
6,215,187 B1 * 4/2001 Ooto ................. H01L 21/31111
438/210

(Continued)

FOREIGN PATENT DOCUMENTS

CN    101609795 A    12/2009
CN    102810502 A    12/2012
(Continued)

OTHER PUBLICATIONS

Written Opinion cited in PCT/CN2021/083066, mailed on Jul. 2, 2021, 6 pages.
(Continued)

*Primary Examiner* — Britt D Hanley
*Assistant Examiner* — Vicki B. Booker
(74) *Attorney, Agent, or Firm* — Kilpatrick Townsend & Stockton LLP

(57) ABSTRACT

Embodiments of the present application provide a semiconductor structure and its manufacturing method. The method for manufacturing a semiconductor structure includes: providing a substrate and a dielectric layer located on the substrate, the substrate being provided therein with a conductive structure; etching a certain thickness of the dielectric layer to form a first groove; performing an isotropic etching (Continued)

process on the dielectric layer located at the bottom of the first groove to form a second groove, a maximum width of the second groove being greater than a bottom width of the first groove in a direction parallel with a surface of the substrate; and etching the dielectric layer located at the bottom of the second groove to form a third groove exposing the conductive structure.

13 Claims, 6 Drawing Sheets

(51) Int. Cl.
    *H01L 23/528*      (2006.01)
    *H01L 23/535*      (2006.01)
    *H01L 49/02*      (2006.01)

(52) U.S. Cl.
    CPC .. *H01L 21/76831* (2013.01); *H01L 21/76895* (2013.01); *H01L 23/5283* (2013.01); *H01L 23/535* (2013.01); *H01L 28/91* (2013.01); *H01L 2221/1063* (2013.01)

(58) Field of Classification Search
    CPC ........... H01L 21/76895; H01L 23/5283; H01L 23/535; H01L 28/91; H01L 2221/1063; H01L 23/5222; H01L 2221/101; H10B 12/00
See application file for complete search history.

(56) References Cited

U.S. PATENT DOCUMENTS

| | | | |
|---|---|---|---|
| 6,271,084 | B1 | 8/2001 | Tu et al. |
| 6,548,853 | B1* | 4/2003 | Hwang ................ H10B 12/318 361/306.3 |
| 6,583,461 | B2* | 6/2003 | Yokoyama ............. H01L 28/91 438/243 |
| 2002/0163026 | A1* | 11/2002 | Park ........................ H01L 28/91 257/E21.01 |
| 2004/0085708 | A1* | 5/2004 | Oh .......................... H01L 28/91 361/306.3 |
| 2008/0070375 | A1 | 3/2008 | Kim |
| 2016/0233217 | A1* | 8/2016 | Brain ................ H01L 21/02181 |

FOREIGN PATENT DOCUMENTS

| | | |
|---|---|---|
| CN | 103811299 A | 5/2014 |
| CN | 209087833 U | 7/2019 |
| JP | H03263863 A | 11/1991 |
| TW | 556238 B | 10/2003 |

OTHER PUBLICATIONS

International Search Report as cited in PCT Application No. PCT/CN2021/083066 mailed Jul. 2, 2021, 4 pages.

\* cited by examiner

SEMICONDUCTOR STRUCTURE INCLUDING A TRENCH HAVING A HIGH ASPECT RATIO FORMED BY ETCHING AND ITS MANUFACTURING METHOD AS APPLIED TO FORMATION OF A CAPACITOR IN THE SEMICONDUCTOR STRUCTURE

CROSS-REFERENCE TO RELATED APPLICATIONS

This application claims priority to Chinese Patent Application No. 202010317800.1, entitled "SEMICONDUCTOR STRUCTURE AND ITS MANUFACTURING METHOD", filed on Apr. 21, 2020, the entire content of which is incorporated herein by reference.

TECHNICAL FIELD

Embodiments of the present application relate to the field of semiconductors, in particular to a semiconductor structure and its manufacturing method.

BACKGROUND

A groove is a common shape in semiconductor structures, and can be filled with a conducting medium to form a conductive plug, or with an insulating material to form an isolation structure, or the like.

In a prior art, when a trench with a high aspect ratio is formed by etching, components of an etchant are reduced continuously with an increase in an etch depth, so that an original etching line width cannot be maintained in an etching process, which results in a groove etched with a gradually narrowed line width, and may further influence performance of semiconductor structures.

SUMMARY

Some embodiments of the present application provide a semiconductor structure and its manufacturing method to solve the performance problem of the semiconductor structure caused by the gradually narrowed trench line width.

n order to solve the above problems, some embodiments of the present application provide a method for manufacturing a semiconductor structure, including: providing a substrate and a dielectric layer located on the substrate, the substrate being provided therein with a conductive structure; etching a certain thickness of the dielectric layer to form a first groove; performing an isotropic etching process on the dielectric layer located at the bottom of the first groove to form a second groove, a maximum width of the second groove being greater than a bottom width of the first groove in a direction parallel with a surface of the substrate; and etching the dielectric layer located at the bottom of the second groove to form a third groove exposing the conductive structure.

Correspondingly, some embodiments of the present application further provide a semiconductor structure, including: a substrate and a dielectric layer located on the substrate, the substrate being provided therein with a conductive structure; a first groove, a second groove and a third groove which are communicated in sequence in the dielectric layer in a direction of the dielectric layer facing the substrate, a maximum width of the second groove being greater than a bottom width of the first groove in a direction parallel with the surface of the substrate, the third groove exposing the conductive structure.

Compared with the prior art, the technical solution according to the embodiment of the present application has the following advantages.

In the embodiments of the present application, the isotropic etching process is adopted after a certain thickness of the dielectric layer is etched, so that the width of the subsequently formed second groove is greater than a bottom line width of the first groove, which thus increases an average line width, a cross sectional area and a perimeter of the final entire groove without changing an opening width of the first groove, thereby helping improve related performance parameters of the semiconductor structure.

In addition, by limiting the etch rate of the isotropic etching process in the direction parallel with the surface of the substrate, damages to adjacent structures are avoided while duration of the etching process is shortened.

In addition, when the dielectric layer is provided with the support layer, the first groove formed by etching penetrates through the support layer, so that the support layer is prevented from being corroded by the subsequent isotropic etching process, thereby guaranteeing structural stabilities of the dielectric layer.

BRIEF DESCRIPTION OF DRAWINGS

The exemplary descriptions of one or more embodiments are made by using the corresponding drawings. These exemplary descriptions are not intended to limit the embodiments. Elements with same reference numerals in drawings refer to similar elements. The figures of the drawings are not shown to scale unless specifically stated.

DESCRIPTION OF EMBODIMENTS

As is known in the art, conventional semiconductor structures may not meet predetermined performance requirements.

Figure 1:
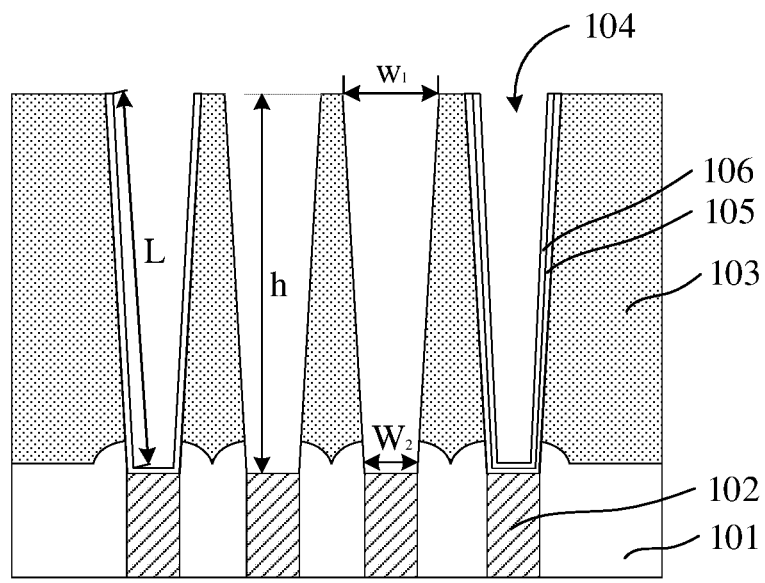
FIG. 1 is a schematic structural diagram of a semiconductor structure.

An analysis is made now with reference to FIG. 1, which is a schematic structural diagram of a semiconductor structure. Referring to FIG. 1, the semiconductor structure includes a substrate 101 and a dielectric layer 103 located on the substrate 101, wherein the substrate 101 has a conductive structure 102 therein, and the dielectric layer 103 has a groove 104 therein to expose the conductive structure 102.

Since the groove 104 formed by the conventional etching process has a characteristic of narrowing a line width gradually, an average line width, perimeter or cross-sectional area of the groove 104 formed by the conventional etching process are less than those of an ideal fixed-line-width groove. For example, the groove 104 has an average line width of (W1+W2)/2, a perimeter of 2L+W2, and a cross-sectional area of (W1+W2)×h/2, while the ideal fixed-line-width groove has an average line width of W1, a perimeter of 2h+W1, and a cross-sectional area of W1$h$/2, where L is a diagonal side wall length of the groove 104, W2 is a bottom line width, h is a depth of the groove 104, and W1 is a top line width, which may result in the semiconductor structure whose performance related to the average line width, cross-sectional area or perimeter may not come up to expectation.

Taking a capacitance of a capacitor as an example, the semiconductor structure includes an electrode layer 105 and a capacitor dielectric layer 106, the electrode layer 105 is located on the side wall and at the bottom of the groove 104, the capacitor dielectric layer 106 is located on a surface of the electrode layer 105, the electrode layer 105 serves as an electrode of the capacitor, the capacitance of the capacitor is positively correlated with a contact area of the electrode layer 105 and the capacitor dielectric layer 106, and the contact area of the electrode layer 105 is positively correlated with the perimeter or average line width (depending on the capacitor structure) of the groove 104. Thus, when the groove 104 with a gradually narrowed line width is formed by using the common etching process, the capacitance of the capacitor may not meet the predetermined performance requirement.

In order to solve the above problems, embodiments of the present application provide a method for manufacturing a semiconductor structure, which increases a perimeter and a cross-sectional area of the groove by increasing an average line width thereof, and further increases performance parameters of the semiconductor structure related to the average line width, the perimeter, or the cross-sectional area of the groove.

In order to make the objectives, the technical solutions, and the advantages of the embodiments of the present application more clear, the detailed description of the embodiments of the present application is given below in combination with the accompanying drawings. The ordinary skills in the art can understand that many technical details are provided in the embodiments of the present application so as to make the readers better understand the present application. However, even if these technical details are not provided and based on a variety of variations and modifications of the following embodiments, the technical solutions sought for protection in the present application can also be realized.

FIGS. 2 to 7 are schematic diagrams of sectional structures corresponding to steps of a method for manufacturing a semiconductor structure according to one embodiment of the present application.

Figure 2:
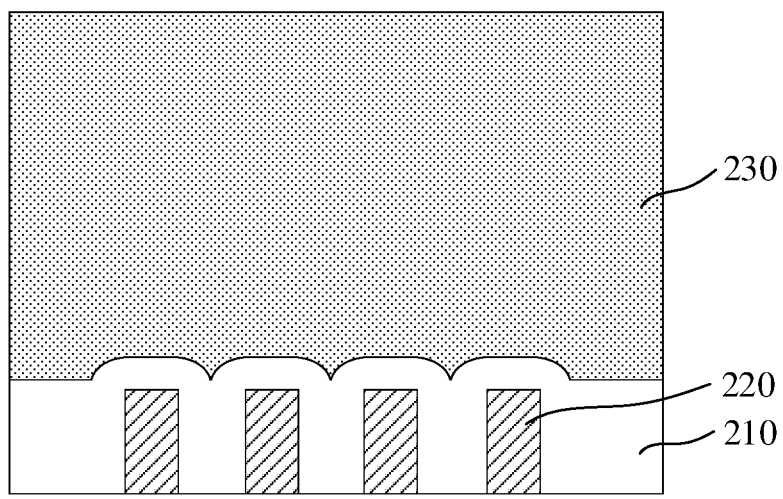
FIGS. 2 to 4 are schematic diagrams of sectional structures corresponding to steps of a method for manufacturing a semiconductor structure according to one embodiment of the present application.

Referring to FIG. 2, a substrate 210 and a dielectric layer 230 located on the substrate 210 are provided, the substrate 210 having a conductive structure 220 therein.

In this embodiment, part of the material of the substrate 210 is located between the conductive structure 220 and the dielectric layer 230, and the material hardness of the substrate 210 is greater than that of the dielectric layer 230, so that the substrate 210 located between the conductive structure 220 and the dielectric layer 230 can slow down an etch rate of the etching process, which is beneficial to stopping the etching process in time to avoid damages to the conductive structure 220.

The conductive structure 220 may be made of not only a single metal material, for example, tungsten or copper, but also complex electronic devices, which is related to application scenarios of the semiconductor structure and may be decided as needed.

Figure 3:
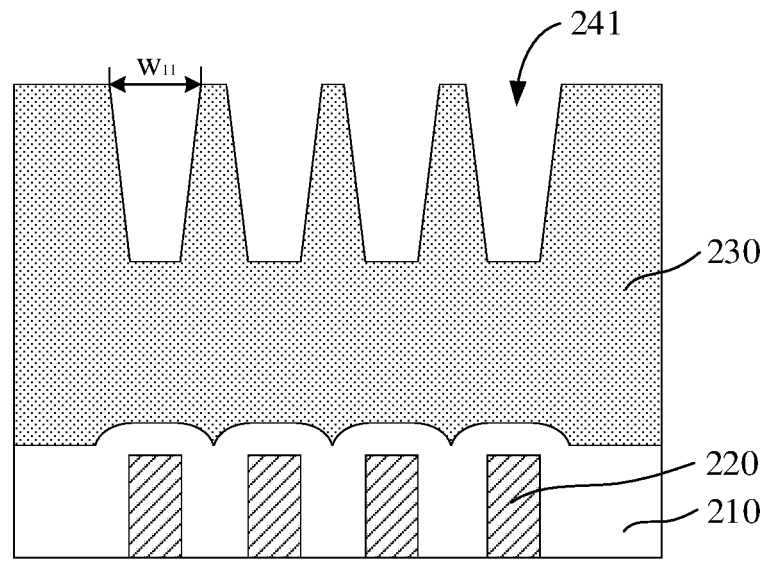

Referring to FIG. 3, a certain thickness of the dielectric layer 230 is etched to form a first groove 241.

Since the depth of the first groove 241 may have an influence on the average line width, cross-sectional area, or aperture of the finally formed groove, the depth of the first groove 241 shall be determined according to the required average line width, cross-sectional area, or perimeter before the first groove 241 is formed.

In addition, a size of an opening width W11 of the first groove 241 also has an influence on the cross-sectional area and the perimeter of the finally formed groove, and therefore, the opening width W11 of the first groove 241 is required to be determined according to the performance requirements of the semiconductor structure before the etching process is performed. The performance requirements include aspect ratio requirements of the final formed groove.

In this embodiment, the process of forming the first groove 241 is an anisotropic etching process, and due to the defects of the etching process, that is, etchant components are reduced continuously with an increase in an etch depth, the first groove 241 with a gradually narrowed line width is formed finally.

In this embodiment, a top width of the first groove 241 ranges from 50 nm to 54 nm, for example, 51 nm, 52 nm or 53 nm.

Figure 4:
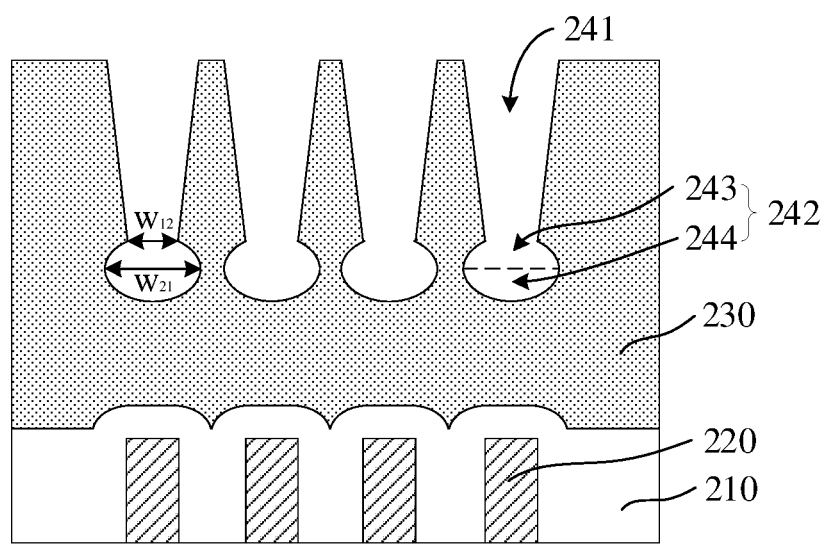

Referring to FIG. 4, the isotropic etching process is performed on the dielectric layer 230 at the bottom of the first groove 241 to form a second groove 242, and a maximum width W21 of the second groove 242 is greater than a bottom width W12 of the first groove 241 in a direction parallel with a surface of the substrate 210.

It should be noted that the above-mentioned bottom width W12 of the first groove 241 refers to the bottom width of the first groove 241 during the anisotropic etching process. The etchant may contact the side wall of the first groove 241 during the anisotropic etching process, so that the first groove 241 may be slightly enlarged.

In this embodiment, the isotropic etching process has an etch width of 2 nm to 3 nm, e.g. 2.3 nm, 2.5 nm or 2.7 nm, in a direction parallel with the substrate 210. The limitation on the etch width during the isotropic etching process in the direction parallel with the substrate 210 is beneficial to avoiding damages of the etching process to the adjacent structure.

For example, in the present embodiment, the substrate 210 has a plurality of discrete conductive structures 220 therein, and the dielectric layer 230 has a plurality of first grooves 241 and second grooves 242 therein corresponding to the conductive structures 220. The limitation on the etch width during the isotropic etching process in the direction parallel with the surface of the substrate 210 is beneficial not to etching through the adjacent second groove 242, which then avoids contact of electrode layers (not shown) in different second grooves 242.

In this embodiment, the second groove 242 has a circular arc-shaped side wall and a circular arc-shaped bottom surface, both of which are recessed towards a direction away from a center of the second groove 242; the center of the second groove 242 refers to a center point of a line segment where the second groove 242 has the maximum width W21. The reason for forming the circular arc-shaped side wall and bottom surface is as follows.

Figure 5:
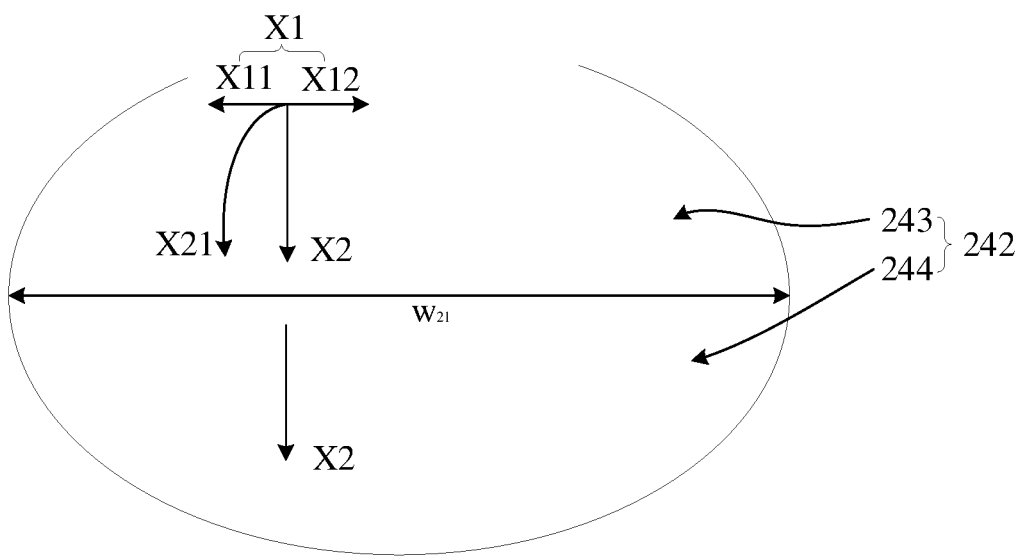
FIG. 5 is a schematic diagram of an etch direction of an anisotropic etching process according to one embodiment of the present application.

Referring to FIG. 5, the second groove 242 includes a first region 243 and a second region 244, and the isotropic etching process has a parallel etch rate X1 in a direction parallel with the surface of the substrate 210 and a vertical etch rate X2 in a direction perpendicular to the surface of the substrate 210. Since the parallel etch rate X1 includes a first etch rate X11 and a second etch rate X12 which are opposite in direction, i.e., etching in multiple directions is required, the parallel etch rate X1 will be decreased earlier than the vertical etch rate X2 due to a reduction in etching components when the second groove 242 is etched.

Thus, when the first etch rate X11 is decreased but the vertical etch rate X2 is not yet changed greatly, a single-sided etch direction X21 which is continuously bent toward the direction perpendicular to the surface of the substrate 210 is formed until the single-sided etch direction X21 is perpendicular to the surface of the substrate 210. It should be noted that since the vertical etch rate X2 is also decreased due to the reduction in the etching component, and the line width is gradually narrowed, the timing when the first etch direction X21 is perpendicular to the surface of the substrate 210 is actually the timing when the parallel etch rate X1 just enables to maintain the line width of the groove constant, at which the second groove 242 has the maximum width W21.

Correspondingly, when the second region 244 is etched, the etching component is further reduced, the parallel etch rate X1 can no longer maintain the fixed line width of the groove, causing the line width to start to narrow, and the vertical etch rate X2 is further reduced due to the reduction in the etching component. When the etching components are completely consumed, the vertical etch rate X2 is reset to zero, the line width of the groove is also reset to zero, and finally, the circular arc-shaped side wall and bottom surface are formed.

In this embodiment, the isotropic etching process includes a wet etching process, and an etchant of the wet etching process includes a hydrofluoric acid solution, specifically, a diluted hydrofluoric acid solution.

Figure 6:
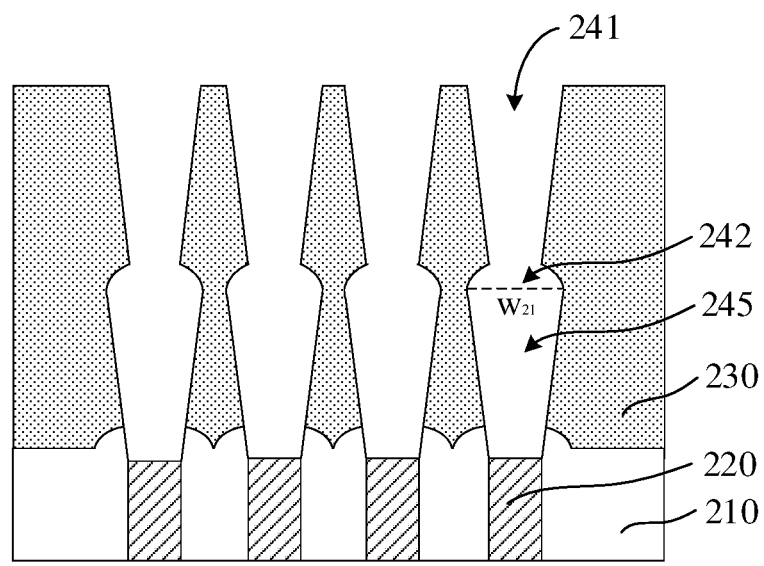
FIGS. 6 and 7 are schematic diagrams of sectional structures corresponding to steps of the method for manufacturing a semiconductor structure according to one embodiment of the present application.

Referring to FIG. 6, the dielectric layer 230 located at the bottom of the second groove 242 is etched to form a third groove 245 exposing the conductive structure 220.

In this embodiment, the etching process for forming the third groove 245 is the anisotropic etching process. Since the anisotropic etching process has a high etch rate in the direction perpendicular to the surface of the substrate 210 and a nearly-zero etch rate in the direction parallel with the surface of the substrate 210, when the etchant contacts the side wall surface of the second groove 242, the third groove 245 is formed by etching with the maximum width W21 of the second groove 242 as the top line width.

Figure 7:
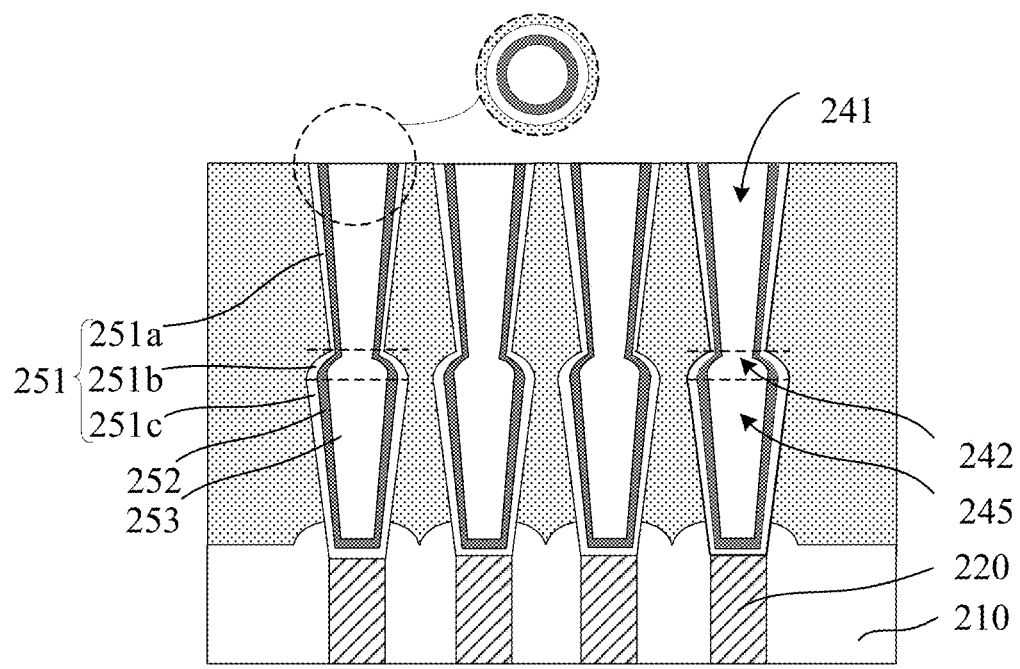

Referring to FIG. 7, after the third groove 245 is formed, the first electrode layer 251 includes a first part 251a formed on the side walls of the first groove 241, a second part 251b formed on the side walls the second groove 242 and a third part 251c formed on the side walls and bottom of the third groove 245, the capacitor dielectric layer 252 is formed on the surface of the first electrode layer 251, and the second electrode layer 253 is formed on the surface of the capacitor dielectric layer 252.

It should be noted that the schematic partial view of FIG. 7 is a partial top view.

In this embodiment, the groove formed by the first groove, the second groove and the third groove has a greater aspect ratio, and is surround by the second electrode layer 253, the capacitor dielectric layer 252, the first electrode layer 251 and the dielectric layer 230 in sequence. Therefore, the capacitor formed by the first electrode layer 251 and the second electrode layer 253 can be regarded as a columnar capacitor, and the capacitance of the columnar capacitor can be calculated according to the way of the columnar capacitor as follows:

$C = 2\pi\varepsilon H/Ln(R1/R2)$, where H is the height of a capacitive post, R1 is an inner radius of the capacitive post, and R2 is an outer radius of the capacitive post.

In this embodiment, increasing the groove line width of a partial region under the condition of not changing the thickness of the capacitor dielectric layer 252 is equivalent to increasing the average line width of the groove, that is, increasing the values of R1 and R2 and decreasing a quotient of R1/R2, thereby increasing the capacitor capacitance C.

In the present embodiment, the adoption of the isotropic etching process improves the performance of the semiconductor structure related to the average line width, the cross-sectional area or the perimeter of the groove.

Figure 8:
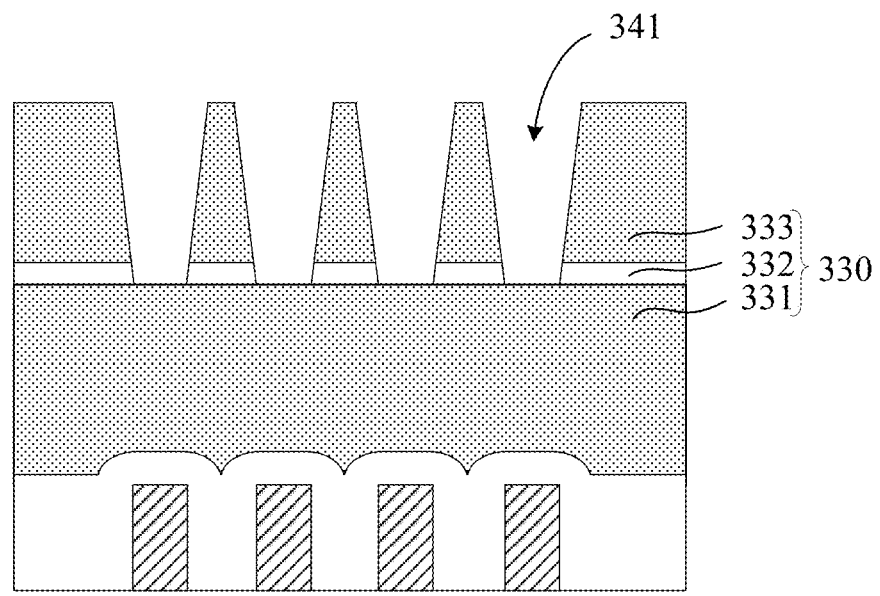
FIG. 8 is a schematic diagram of a sectional structure corresponding to one step of a method for manufacturing a semiconductor structure according to another embodiment of the present application.
Figure 9:
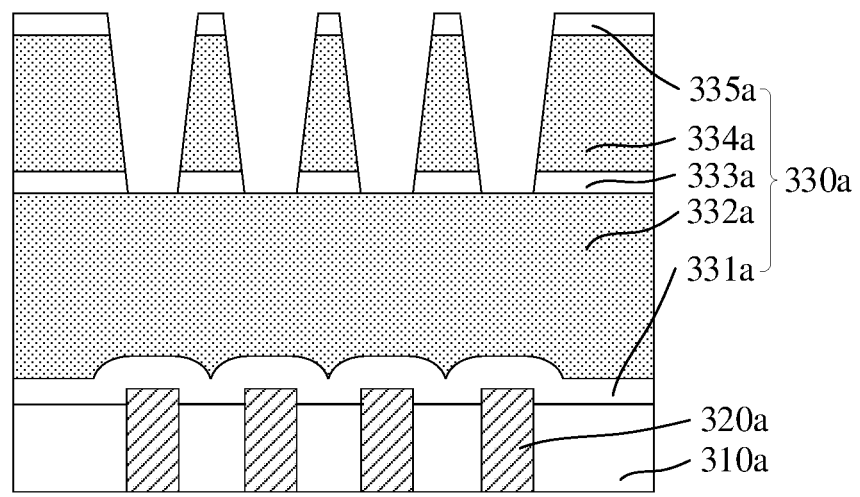
FIG. 9 is a schematic diagram of a sectional structure corresponding to one step of a method for manufacturing a semiconductor structure according to yet another embodiment of the present application.

Another embodiment of the present application further provides a method for manufacturing a semiconductor structure, which is different from the previous embodiment in that in the present embodiment, the dielectric layer includes a first dielectric layer, a support layer, and a second dielectric layer. Detailed descriptions will be made below with reference to FIGS. 8 and 9. FIG. 8 is a schematic diagram of a sectional structure corresponding to one step of a method for manufacturing a semiconductor structure according to another embodiment of the present application; FIG. 9 is a schematic diagram of a sectional structure corresponding to one step of a method for manufacturing a semiconductor structure according to yet another embodiment of the present application. The same or corresponding manufacturing steps as or to those in the previous method embodiment may refer to corresponding descriptions in the previous method embodiment, which are not described in detail below.

Referring to FIG. 8, the dielectric layer 330 includes a first dielectric layer 331, a support layer 332, and a second dielectric layer 333, which are sequentially stacked, and the material hardness of the support layer 332 is greater than the material hardness of the first dielectric layer 331, which functions to support the semiconductor structure.

In the present embodiment, etching a certain thickness of the dielectric layer 330 to form the first groove 341 includes: etching the second dielectric layer 333 and the support layer 332 until the first dielectric layer 331 below the support layer 332 is exposed. Therefore, the support layer 332 is prevented from being excessively corroded by the subsequent isotropic etching process, so that the stability of the dielectric layer 330 is guaranteed. In this embodiment, the etch rate of the isotropic etching process on the material of the first dielectric layer 331 is greater than that on the material of the support layer 332. Therefore, the support layer 332 is further prevented from being corroded by the isotropic etching process, so that the stability of the dielectric layer 330 is guaranteed.

In other embodiments, referring to FIG. 9, the dielectric layer 330a includes a bottom support layer 331a located at the bottom of the first dielectric layer 332a, a middle support layer 333a located between the first dielectric layer 332a and the second dielectric layer 334a, and a top support layer 335a located at the top of the second dielectric layer 334a, wherein the bottom support layer 331a may serve as an isolation for the conductive structure 320a; in addition, since the practical application scenario of the semiconductor structure is uncertain, in the practical application scenario, the first dielectric layer 332a may be located above the bottom support layer 331a or below the bottom support layer 331a, so that both the bottom support layer 331a and the top support layer 335a may support the first dielectric layer 332a, the second dielectric layer 334a, and the capacitor structure formed subsequently.

It should be noted that the substrate 310a may have a role of support by adjusting the material hardness of the substrate 310a without providing an additional bottom support layer 331a.

In this embodiment, the first groove 341 penetrates through the support layer 332 for supporting, so that the support layer 332 is prevented from being excessively eroded by the subsequent isotropic etching process, thereby guaranteeing the stability of the dielectric layer 330.

Figure 10:
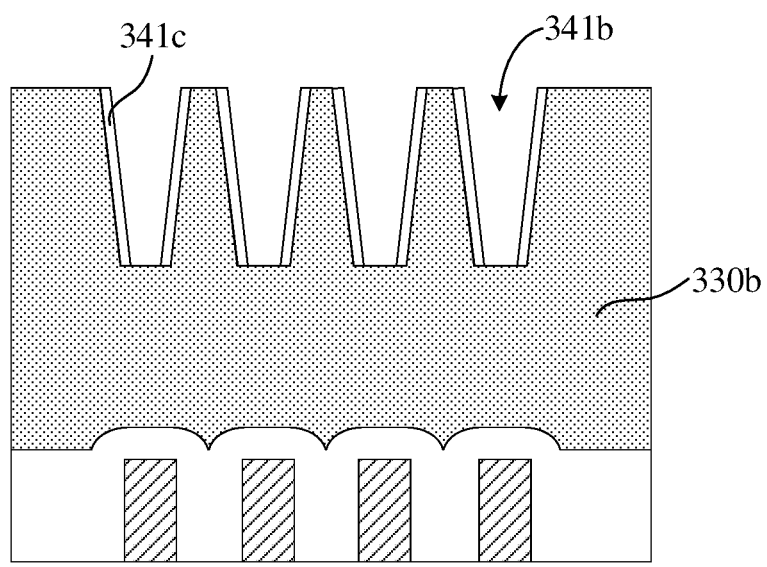
FIG. 10 is a schematic diagram of a sectional structure corresponding to one step of a method for manufacturing a semiconductor structure according to still another embodiment of the present application.

In another embodiment of the present application, there is further provided a method for manufacturing a semiconductor structure, which is different from the previous embodiment in that in the present embodiment, a protective layer is formed on a side wall of the first groove before the second groove is formed. Detailed descriptions will be made below with reference to FIG. 10. FIG. 10 is a schematic diagram of a sectional structure corresponding to one step of a method for manufacturing a semiconductor structure according to still another embodiment of the present application. The same or corresponding manufacturing steps as or to those in the previous method embodiment may refer to corresponding descriptions in the previous method embodiment, which are not described in detail below.

In this embodiment, after the first groove 341b is formed, the protective layer 341c is formed on the side wall of the first groove 341b, and an etch selectivity ratio of the material of the protective layer 341c to the material of the dielectric layer 330b is less than 1; in addition, the protective layer 341c is removed after the formation of the second groove.

Thus, the isotropic etching process is beneficial to preventing the etchant from etching the side wall of the first groove 341b, the etching including regular etching and irregular etching, thereby ensuring that the bottom width of the first groove 341b is less than the maximum width of the second groove and that the first groove 341b has a smooth side wall, and thus ensuring that the shape of the finally formed first groove 341b meets the preset requirement; in addition, the etchant is prevented from over-etching the side wall of the first groove 341b, thereby ensuring that the adjacent first grooves 341b are separated from each other.

The protective layer 341c located on the side wall of the first groove 341b may be formed by first forming a protective film covering the surface of the dielectric layer 330b, and then etching away the protective film on the top of the dielectric layer 330b and the protective film at the bottom of the first groove 341b.

In this embodiment, the protective layer 341c is formed on the side wall of the first groove 341b prior to the formation of the second groove, which is beneficial to preventing the etchant from etching the side wall of the first groove 341b, thereby ensuring that the first groove 341b structure meeting the predetermined requirement can be obtained.

Correspondingly, the embodiment of the present application further provides a semiconductor structure which can be manufactured by adopting any one of the methods.

Figure 11:
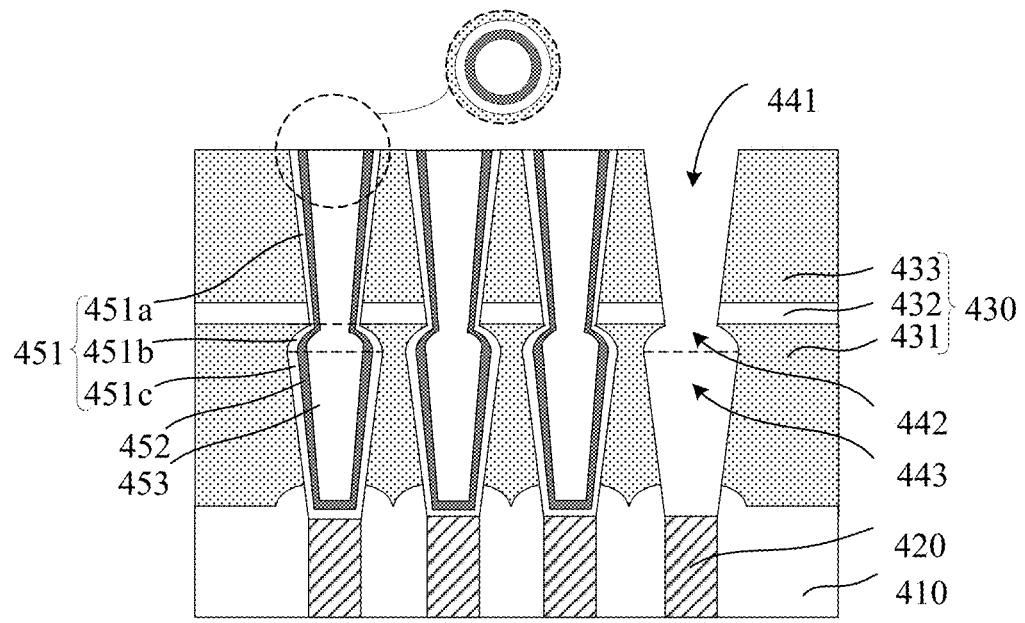
FIG. 11 is a schematic diagram of sectional structure of a semiconductor structure according to yet another embodiment of the present application.

Referring to FIG. 11, in the present embodiment, the semiconductor structure includes: a substrate 410 and a dielectric layer 430 located on the substrate 410, the substrate 410 having a conductive structure 420 therein; in the direction of the dielectric layer 430 toward the substrate 410, the maximum width of the second groove 442 is greater than the bottom width of the first groove 441, and the third groove 443 exposes the conductive structure 420.

The semiconductor structure according to the present application will be described in detail below with reference to the accompanying drawings. For clarity of illustration, the material in some of the grooves is not shown.

In this embodiment, the dielectric layer 430 includes a first dielectric layer 431, a support layer 432 and a second dielectric layer which are stacked in sequence, and the material hardness of the support layer 432 is greater than that of the first dielectric layer 431. The first groove 441 penetrates through support layer 432.

The material of the first dielectric layer 431 is the same as that of the second dielectric layer 433, the material of the first dielectric layer 431 includes silicon dioxide, and the material of the support layer 432 includes silicon nitride; in other embodiments, the material of the first dielectric layer is different from the material of the second dielectric layer.

In this embodiment, the first electrode layer 451 includes a first part 451a on the side wall of the first groove 441, a second part 451b on the side wall of the second groove 442 and a third part 451c on the side wall and bottom of the third groove 443. The surface of the first electrode layer 451 is provided with the capacitor dielectric layer 452, and the surface of the capacitor dielectric layer 452 is provided with the second electrode layer 453.

In this embodiment, the second groove 442 has a circular arc-shaped side wall, and the width of the second groove 442 increases progressively in the direction of the dielectric layer 430 toward the substrate 410. Accordingly, the first electrode layer 451 and the second electrode layer 453 located in the second groove 442 have circular arc-shaped surfaces which are recessed in a direction away from the center of the second groove 442.

Figure 12:
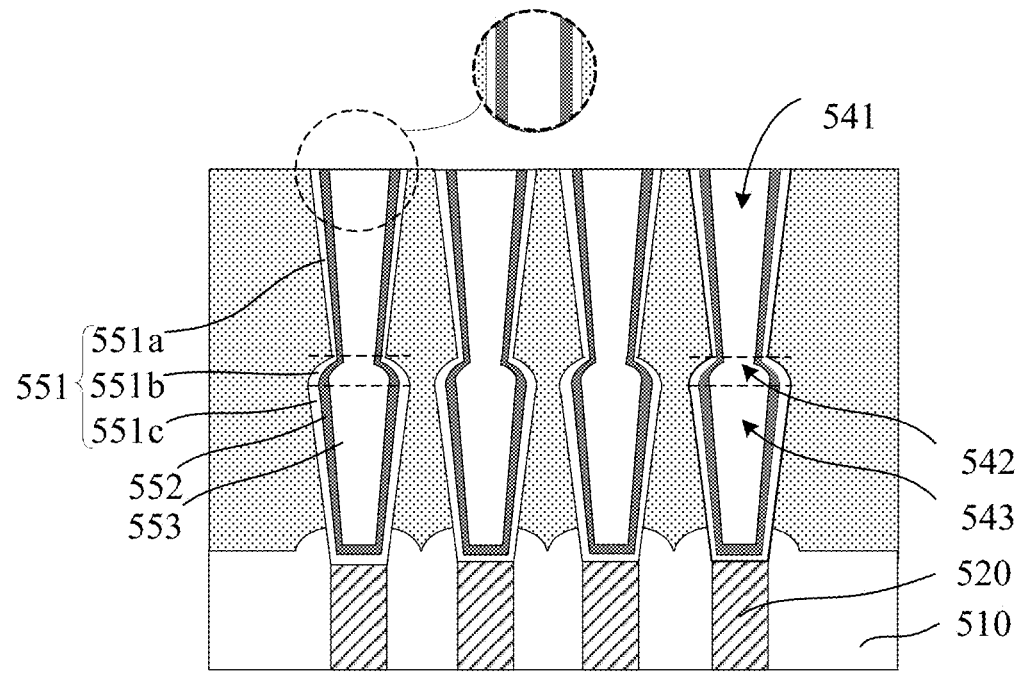
FIG. 12 is a schematic diagram of sectional structure of another semiconductor structure according to yet another embodiment of the present application.

In this embodiment, the second electrode layer 453, the capacitor dielectric layer 452, and the first electrode layer 451 are sequentially wrapped, and in the cross section parallel with the top surface of the dielectric layer 430, in the first groove 441 or the second groove 442, the capacitor dielectric layer 452 surrounds the second electrode layer 453, and the first electrode layer 451 surrounds the capacitor dielectric layer 452; in other embodiments, referring to FIG. 12, the first, second and third grooves have an extension direction parallel with the top surface of the dielectric layer; correspondingly, the first electrode layer 551, the capacitor dielectric layer 552 and the second electrode layer 553 have the same extension direction, the capacitor dielectric layer 552 is located on the side wall and bottom of the second electrode layer 553, the first electrode layer 551 is located on the side wall and bottom of the capacitor dielectric layer 552, and the capacitor dielectric layer 552 is located on opposite sides of the second electrode layer 553 in the first or second groove in the cross section parallel with the top surface of the dielectric layer, the first electrode layer 551 includes a first part 551a formed on the side walls of the first groove 541, a second part 551b formed on the side walls the second groove 542 and a third part 551c formed on the side walls and bottom of the third groove 543.

The present embodiment provides a new semiconductor structure which improves the performance of the semiconductor structure related to the average line width, cross-sectional area, or perimeter of the groove without increasing the size of the opening at the top of the groove.

The ordinary skills in the art can understand that the implementations described above are particular embodiments for implementing the present application. In practical uses, various changes in forms and details may be made to the implementations without departing from the spirit and scope of the present application. Any skills in the art may make their own changes and modifications without departing from the spirit and scope of the present application. Therefore, the protection scope of the present application shall be subject to the protection scope of the claims.

What is claimed is:

1. A method for manufacturing a semiconductor structure, comprising:
   providing a substrate and a dielectric layer located on the substrate, the substrate being provided therein with a conductive structure;
   etching the dielectric layer to form a first groove;
   performing an isotropic etching process on the dielectric layer located at a bottom of the first groove to form a second groove, a maximum width of the second groove being greater than a bottom width of the first groove in a direction parallel with a surface of the substrate;
   etching the dielectric layer located at a bottom of the second groove to form a third groove exposing the conductive structure; and
   forming a first electrode layer comprising a first part on a side wall of the first groove, a second part on a side wall of the second groove and a third part on a side wall and bottom of the third groove;
   forming a capacitor dielectric layer on a surface of the first electrode layer;
   forming a second electrode layer on a surface of the capacitor dielectric layer; and,
   wherein the first part, the second part and the third part are integrally formed and in sequence along a direction of the first electrode layer facing the substrate, and the third part is in contact with the conductive structure, a sidewall of the second groove is a circular arc-shaped side wall, and the circular arc-shaped side wall is recessed towards a direction away from a center of the second groove.

2. The method according to claim 1, wherein the isotropic etching process has an etch width of 2 nm to 3 nm in a direction parallel with the surface of the substrate.

3. The method according to claim 2, wherein before the isotropic etching process is performed, further comprising: forming a protective layer on the side wall of the first groove, an etch selectivity ratio of a material of the protective layer to a material of the dielectric layer is less than 1, and after formation of the second groove, further comprising removing the protective layer.

4. The method according to claim 1, wherein the isotropic etching process comprises a wet etching process, and an etchant of the wet etching process comprises a hydrofluoric acid solution.

5. The method according to claim 1, wherein the dielectric layer comprises a first dielectric layer, a support layer and a second dielectric layer which are sequentially stacked on the substrate, a material hardness of the support layer is greater than a material hardness of the first dielectric layer; the etching the dielectric layer to form a first groove comprises: etching the second dielectric layer and the support layer until the first dielectric layer below the support layer is exposed.

6. The method according to claim 5, wherein an etch rate of the isotropic etching process on a material of the first dielectric layer is greater than an etch rate of the isotropic etching process on a material of the support layer.

7. A semiconductor structure, comprising:
   a substrate being provided therein with a conductive structure; and
   a first electrode layer comprising a first part, a second part and a third part in sequence along a direction of the first electrode layer facing the substrate, a maximum width of the second part being greater than a bottom width of the first part in a direction parallel with a surface of the substrate, the third part being in contact with the conductive structure;
   a capacitor dielectric layer provided on a surface of the first electrode layer; and
   a second electrode layer provided on a surface of the capacitor dielectric layer; and,
   wherein the second part has a circular arc-shaped side wall, the first electrode layer and the second electrode layer have circular arc-shaped surfaces which are recessed in a direction away from a center of the second part.

8. The semiconductor structure according to claim 7, wherein a width of the second part is gradually increased in the direction of the first electrode layer facing the substrate.

9. The semiconductor structure according to claim 7, further comprising:
   a support layer surrounding the first electrode layer.

10. The semiconductor structure according to claim 9, wherein the first part extends through the support layer.

11. The semiconductor structure according to claim 9, wherein a material of the support layer comprises silicon nitride.

12. The semiconductor structure according to claim 7, wherein in a cross section of the first part or the second part parallel with the surface of the substrate, the capacitor dielectric layer is surrounding the second electrode layer, and the first electrode layer is surrounding the capacitor dielectric layer.

13. The semiconductor structure according to claim 7, wherein the second electrode layer has an extending direction, in a cross section of the first part or the second part parallel with the top surface of the substrate, the capacitor dielectric layer is located on two opposite sides of the second electrode layer.

* * * * *